(12) United States Patent
Oda

(10) Patent No.: US 6,339,220 B1
(45) Date of Patent: *Jan. 15, 2002

(54) THERMAL INFRARED DETECTING DEVICE

(75) Inventor: Naoki Oda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,569

(22) Filed: Mar. 18, 1998

(30) Foreign Application Priority Data

Mar. 31, 1997 (JP) .............................................. 9-080008

(51) Int. Cl.[7] .................................................. G01J 5/20
(52) U.S. Cl. ............................... 250/338.1; 250/338.4; 250/370.01
(58) Field of Search ........................... 250/338.1, 338.4, 250/332, 370.01, 370.08

(56) References Cited

U.S. PATENT DOCUMENTS

| | | | | |
|---|---|---|---|---|
| 3,629,585 A | * | 12/1971 | Desvignes et al. | 250/83 R |
| 5,286,976 A | * | 2/1994 | Cole | 250/349 |
| 5,288,380 A | * | 2/1994 | Jackson, Jr. et al. | 204/192.21 |
| 5,493,177 A | * | 2/1996 | Muller et al. | 313/578 |
| 5,801,383 A | * | 9/1998 | Wada et al. | 250/332 |
| 5,811,815 A | * | 9/1998 | Marshall et al. | 250/370.06 |
| 6,034,369 A | * | 3/2000 | Oda | 250/338.1 |

* cited by examiner

Primary Examiner—Constantine Hannaher
Assistant Examiner—Otilia Gabor
(74) Attorney, Agent, or Firm—Michael Best & Friedrich LLC

(57) ABSTRACT

A thermal infrared detecting device includes a lower layer portion having a readout circuit, and an upper layer portion having a bolometer thin film covered with an insulating protective film to perform heat/resistance conversion. The upper layer portion and the lower layer portion are spaced apart from each other while sandwiching a vacuum or sealed gas to form a thermal isolation structure, and also electrically connected to each other through an electrode film formed on the insulating protective film or in the insulating protective film. The bolometer thin film also serves as an infrared absorption film.

6 Claims, 3 Drawing Sheets

THERMAL INFRARED DETECTING DEVICE

BACKGROUND OF THE INVENTION

1. Field of the Invention

The present invention relates to a thermal infrared detecting device having a thermal isolation structure.

2. Description of the Prior Art

Examples of a thermal infrared detecting device are bolometer, pyroelectric, and thermocouple sensors. To improve their sensitivities, development of a thermal isolation structure using micromachining technique, a heat-sensitive material, and an infrared absorption film is essential.

To increase the infrared absorbance of a pyroelectric sensor, a structure shown in FIG. 1 is formed (Parsons and Pedder, J. Vac. Sci. Technol. A6 (1988) 1686). A perfect reflection film (this film also serves as an electrode) 12 is formed on a pyroelectric material 11, and an insulating film 13 having a known refractive index (n) and an absorbance of almost zero is formed to a thickness of $\lambda/(4n)$ where $\lambda$ is the wavelength of an incident infrared ray. Next, a semitransparent thin film (infrared absorption film) 14 matching the vacuum impedance (377 $\Omega/\square$) is formed, thus completing a structure for absorbing an infrared ray. An infrared ray is absorbed by free electrons in the semi-transparent thin film due to destructive interference between the perfect reflection film 12 also serving as the electrode and the semitransparent thin film 14. The absorbed infrared ray is converted into heat to change the spontaneous polarization of the pyroelectric material, and finally read as a change in amount of surface electric charge.

FIG. 2 (U.S. Pat. No. 5,369,280 (1994)) and FIG. 3 (U.S. Pat. No. 5,286,976 (1994)) show the infrared absorption structure of a bolometer sensor. For the infrared absorption structure shown in FIG. 2, a silicon oxide film 15 and an insulating support film 16 are formed on a silicon substrate 1, and then, a lower electrode 17, a bolometer thin film 18, and an upper electrode 19 are formed as an infrared absorption film. The lower electrode is formed as a perfect reflection film. On the other hand, the upper electrode is formed very thin. The resistivity and film thickness of the upper electrode are set by selecting the electrode material and film deposition conditions such that the upper electrode matches the vacuum impedance (377 $\Omega/\square$). As described above, letting n be the refractive index of the material of the bolometer thin film 18, and $\lambda$ be the wavelength of an incident infrared ray, the thickness of the bolometer thin film 18 is given by $\lambda/(4n)$. The infrared absorption mechanism is the same as that shown in FIG. 1: destructive interference takes place between the upper electrode and the lower electrode so that the incident infrared ray is absorbed by free electrons in the upper electrode. The absorbed infrared ray is converted into heat to change the resistance of the bolometer material, and read as a voltage change by flowing a bias current.

A bolometer thermal device shown in FIG. 3 can be formed on a flat silicon substrate 1 without etching the silicon substrate 1, unlike the sensor shown in FIG. 2. Since a large area can be ensured to form a readout circuit in manufacturing the array sensor, the fill factors of the light-receiving portion can be increased, and in other words, the sensitivity of the sensor can be improved. An insulating protective film 20, a perfect reflection film 21, and a sacrificial layer (a cavity 27 is formed therein in the post-process) are formed on the silicon substrate 1, and a silicon nitride film 22, a bolometer thin film 23, and a silicon nitride film 24 are formed on the sacrificial layer and its slanting surface. An electrode interconnection (not shown) from the bolometer thin film to the readout circuit in the silicon substrate is sandwiched between two silicon nitride films and connected to the readout circuit through a contact pad 26. A semitransparent thin film 25 is formed on the silicon nitride film 24. By etching the sacrificial layer in the resultant multilayered structure, a highly sensitive thermal infrared detecting device having a thermal isolation structure can be manufactured. This structure has the same infrared absorption mechanism as described above: destructive interference occurs between the semitransparent thin film 25 and the perfect reflection film 21, so the incident infrared ray is absorbed by free electrons in the semitransparent thin film. The absorbed infrared ray is converted into heat to change the resistance of the bolometer material, and read out as a voltage change by flowing a bias current.

As the first problem of the prior arts shown in FIGS. 1 to 3, the yield of thermal infrared devices lowers. The reason for this is as follows. The semitransparent thin film functioning as the infrared absorption film must be fabricated into a predetermined shape after formation of the film, resulting in an increase in the number of processes. In addition, generally, the semitransparent thin film must be made very thin, and its sheet resistance is largely affected by the roughness of the underlayer.

As the second problem, in the prior art shown in FIG. 2, the thermal time constant becomes large, so an afterimage is generated in imaging. The reason for this is as follows. When the infrared absorbance is to be increased in the upper electrode/bolometer thin film/lower electrode structure on the support film, the bolometer thin film must be thickened, resulting in a large thermal capacity.

SUMMARY OF THE INVENTION

The present invention has been made in consideration of the above situation, and has as its object to provide a thermal infrared detecting device having a high manufacturing yield, high productivity, small thermal time constant, and a minimum afterimage.

In order to achieve the above object, according to the first aspect of the present invention, there is provided a thermal infrared detecting device comprising a lower layer portion having a readout circuit, and an upper layer portion having a bolometer thin film covered with an insulating protective film to perform heat/resistance conversion, wherein the upper layer portion and the lower layer portion are spaced apart from each other while sandwiching a vacuum or sealed gas to form a thermal isolation structure, and also electrically connected to each other through an electrode film formed on the insulating protective film or in the insulating protective film, and the bolometer thin film also serves as an infrared absorption film.

According to the second aspect of the present invention, the bolometer thin film of the first aspect has a resistivity of 1 to 10 m$\Omega$cm and a thickness of 500 to 2,000 Å.

According to the third aspect of the present invention, the bolometer thin film of the second aspect essentially consists of a manganese-based oxide.

According to the fourth aspect of the present invention, the bolometer thin film of the second aspect essentially consists of a vanadium compound.

As is apparent from the above aspects, according to the present invention, by adding the function of the infrared absorption film to the bolometer thin film of the thermal infrared detecting device, the manufacturing process becomes simple, so the yield of the device can be improved. In addition, since the thermal time constant becomes small to minimize the afterimage, a real-time infrared image without any sense of incompatibility can be obtained.

As the first effect, the manufacturing process is simplified, so the yield of the thermal infrared detecting device can be improved. The reason for this is as follows. According to the present invention, the bolometer thin film also functions as the infrared absorption film, and no semitransparent thin film need be formed, unlike the prior art.

As the second effect, the afterimage can be minimized in sensing an infrared image using the thermal infrared detecting device, so a real-time image without any sense of incompatibility can be obtained. The reason for this is as follows. According to the present invention, since the bolometer thin film also has the function of the infrared absorption film, the thermal capacity of the light-receiving portion (a portion where the bolometer thin film is formed in FIG. 4B) is decreased, and the thermal time constant also becomes small.

The above and many other advantages, features and additional objects of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENT

A preferred embodiment of the present invention will be described below with reference to the accompanying drawings.

A thermal infrared detecting device of the present invention comprises an upper layer portion and a lower layer portion and has a thermal isolation structure in which the two layers are spaced apart from each other while sandwiching a vacuum or sealed gas. Generally, the lower layer portion has a readout circuit. On the other hand, the upper layer portion has a bolometer thin film for performing heat/resistance conversion, dielectric films formed on the upper and lower sides of the thin film, and an electrode interconnection from the bolometer thin film to the readout circuit.

Since the bolometer thin film also has a function as an infrared absorption film, preferably, the resistivity of the bolometer thin film is adjusted within the range of 1 to 10 mΩcm, and the thickness within the range of 500 to 2,000 Å.

As the material of the bolometer thin film, a manganese-based oxide or a vanadium compound is preferably used.

In the thermal infrared detecting device having the thermal isolation structure, an incident infrared ray causes destructive interference between the bolometer thin film of the upper layer portion and the perfect reflection film of the lower layer portion and is absorbed by free electrons in the bolometer thin film. The absorbed infrared ray is converted into heat to change the resistance of the bolometer thin film, and readout as an electrical signal by flowing a bias current.

Figure 1:
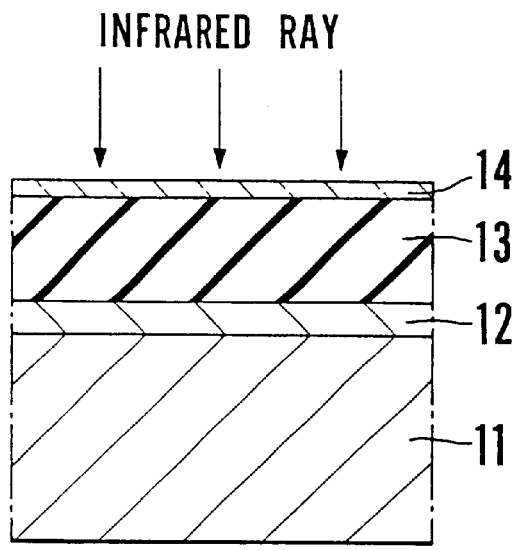
FIG. 1 is a sectional view showing the infrared absorption structure of a conventional pyroelectric infrared detecting device.
Figure 2:
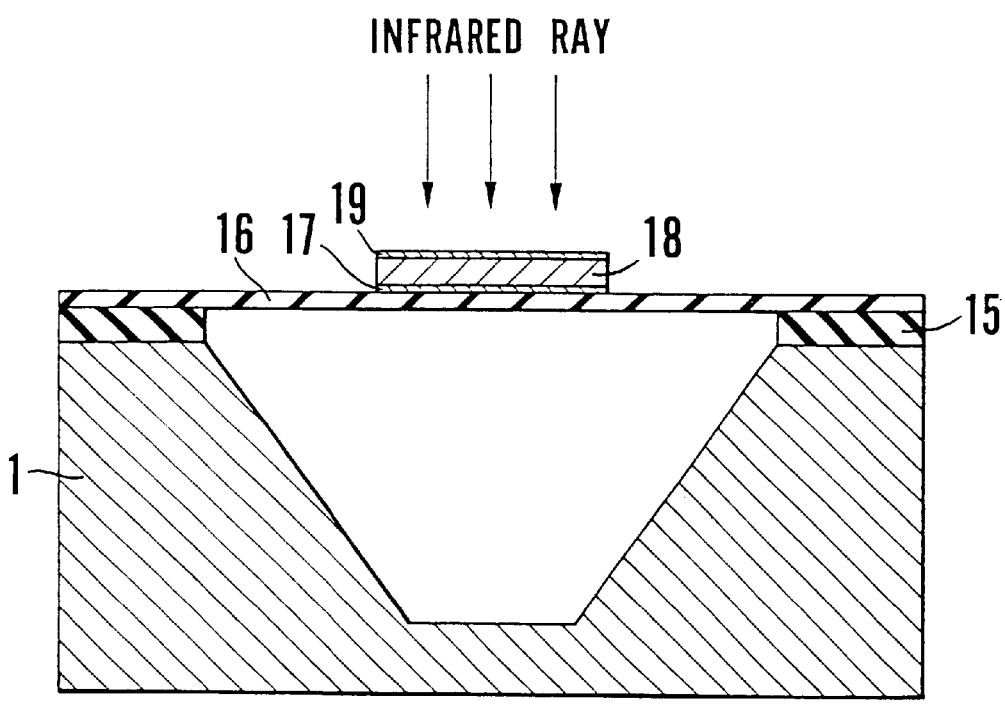
FIG. 2 is a sectional view showing a pixel of a thermal infrared detecting device having a conventional thermal isolation structure.
Figure 3:
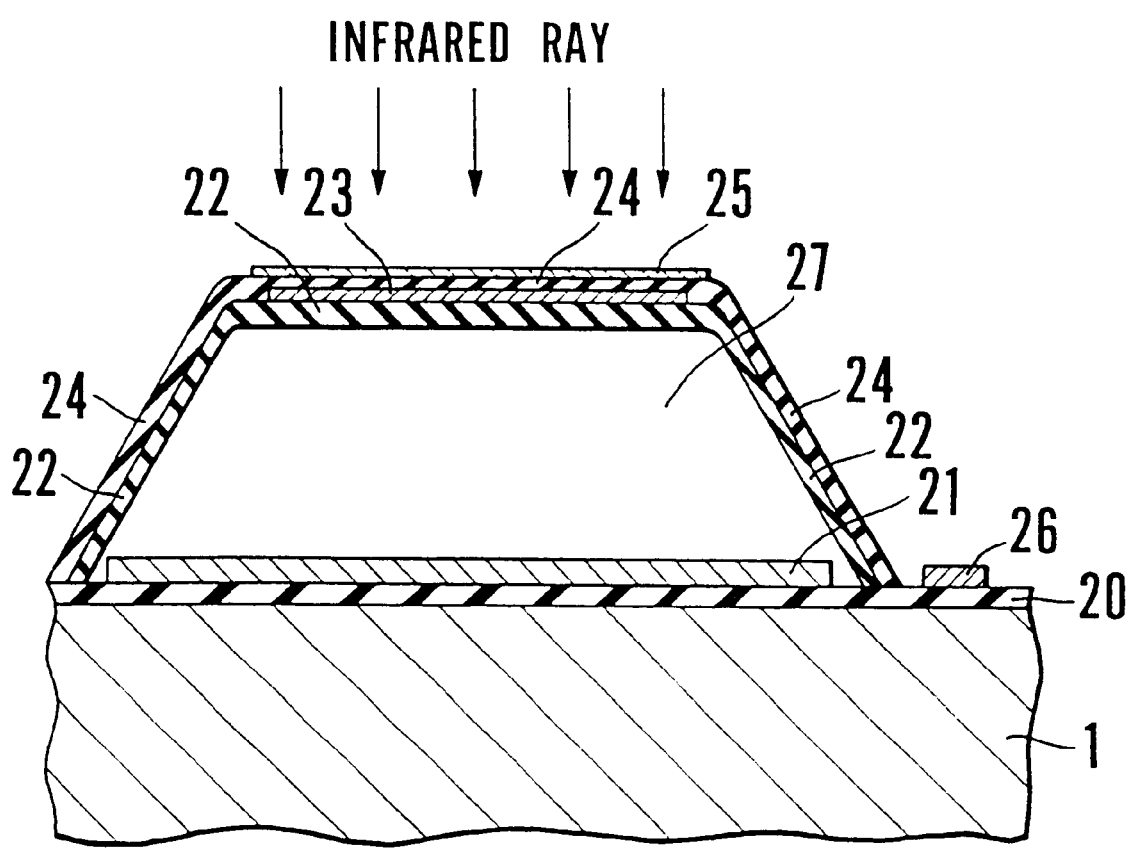
FIG. 3 is a sectional view showing a pixel of a thermal infrared detecting device having a thermal isolation structure as a prior art.
Figure 4A:
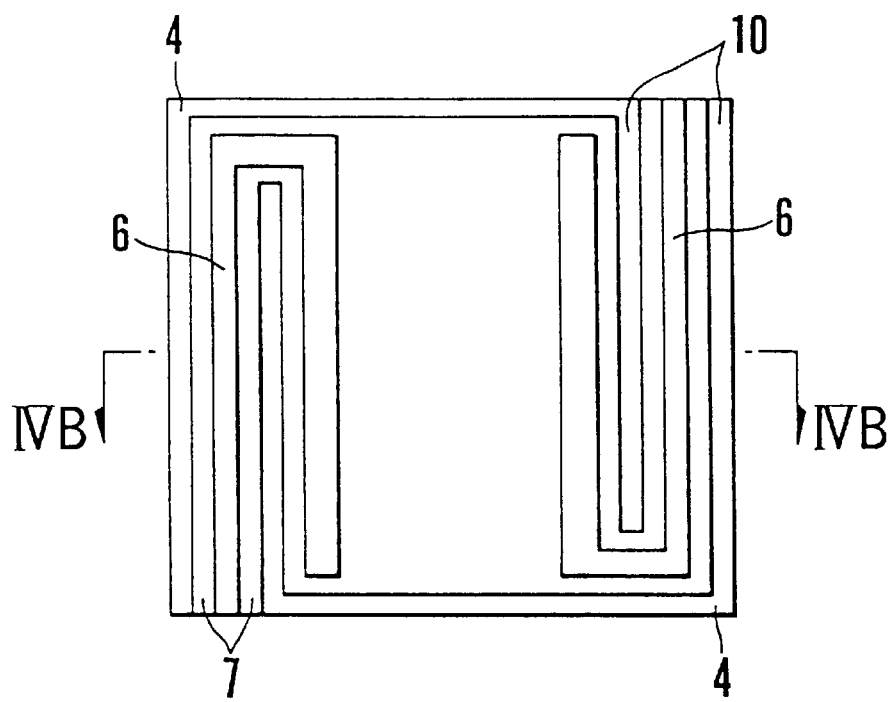
FIGS. 4A and 4B are a schematic plan view and a sectional view, respectively, showing an embodiment of the present invention.
Figure 4B:
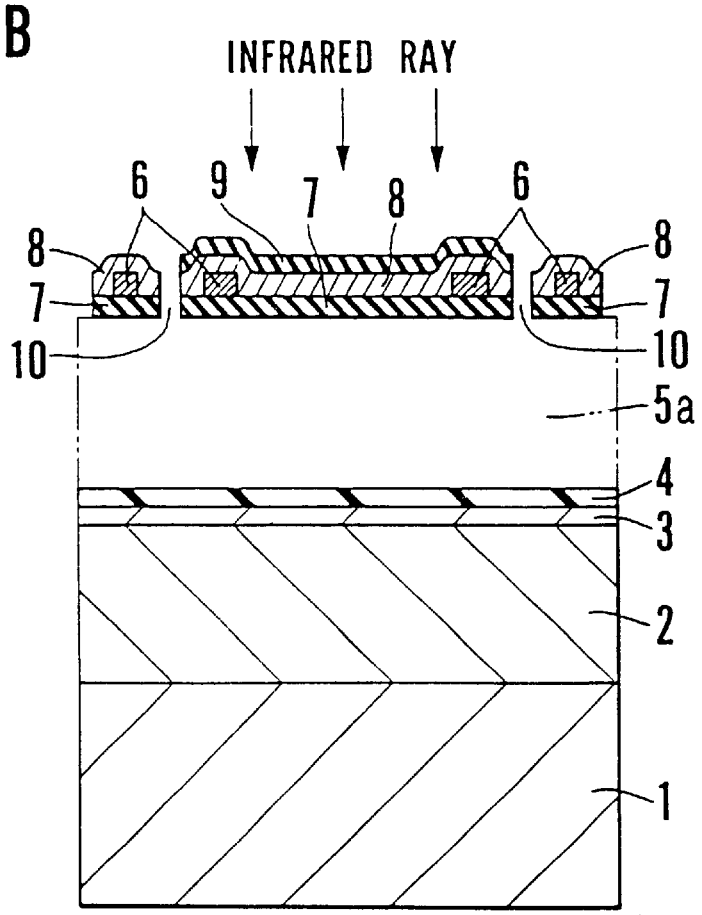

FIGS. 4A and 4B show the structure of the thermal infrared detecting device of the present invention. FIG. 4A is a schematic plan view, and FIG. 4B is a sectional view taken along a line IVB–IVB in FIG. 4A. In FIG. 4A, a bolometer thin film 8 and an insulating protective film 9 are not illustrated.

Referring to FIGS. 4A and 4B, generally, a readout circuit (not shown) is integrated on an Si wafer 1 and covered with an insulating protective film 2 such as a planarized BPSG (Boro Phospho Silicate Glass) film.

The BPSG film 2 having a thickness of about 1 μm is formed on the Si wafer 1 having the readout circuit including a MOSFET and the like by CVD. Subsequently, a metal such as WSi having a high reflectance in the infrared range is formed to about 2,000 Å (formation of a perfect reflection film 3). Next, a protective film 4 of, e.g., $SiO_2$ is formed by low-pressure CVD.

A polysilicon film 5a is formed on the protective film. The polysilicon film 5a becomes a cavity 5 in sacrificial layer etching to be performed later. The polysilicon film 5a is called a sacrificial layer because of this process. Note that the polysilicon film 5a is patterned into a predetermined shape by exposure/development/etching.

An insulating support film 7 is formed on the sacrificial layer. This insulating support film 7 is an SiN film or $SiO_2$ film formed by plasma CVD. Next, a metal such as Ti having a small thermal conductivity is sputtered on the insulating support film 7 and subjected to exposure/development/etching, thereby forming an interconnection pattern (electrode interconnection 6).

A manganese compound or vanadium compound is deposited on such a structure by reactive sputtering to form the bolometer thin film 8. This bolometer thin film is also patterned into a predetermined shape by exposure/development/etching. The bolometer thin film is protected by the insulating protective film 9 such as an SiN film or $SiO_2$ film formed by plasma CVD so as to stand the post-process.

Finally, the cavity formation process, i.e., the sacrificial layer etching process will be described. After formation of the insulating protective film, etching openings 10 are formed by a plasma etcher or ion milling, and the sacrificial layer is wet-etched using a chemical solution such as hydrazine. With this process, a thermal isolation structure in which the upper layer portion appears to float in the air can be formed.

Conditions for absorbing an infrared ray with the thermal isolation structure obtained by the above method are as follows.

(1) The bolometer thin film 8 is semitransparent in the infrared range and also functions as an infrared absorption film. More specifically, when the bolometer thin film has a resistivity of 1 to 10 mΩcm and a thickness of 500 to 2,000 Å, the sheet resistance approaches the vacuum impedance (377 Ω/□), so a high infrared absorbance can be obtained. As a material, a manganese-based oxide such as $La_{1-x}Sr_xMnO_3$ or $MnO_x$ is preferably used.

(2) Destructive interference for an incident infrared ray occurs between the bolometer thin film 8 and the perfect reflection film 3. More specifically, the effective interval between the two films is preferably set to be an odd multiple of ¼ the wavelength of an infrared ray to be detected. For example, when an infrared ray in a 10-μm wavelength band is to be detected, the effective interval between the two films is preferably set to be about 2.5 μm.

What is claimed is:

1. A thermal infrared detecting device comprising:

a lower layer portion having a readout circuit;

an upper layer portion having a bolometer thin film covered with an insulating protective film to perform heat/resistive conversion, said bolometer thin film having a resistivity in order of about 1 to 10 mΩcm and a thickness of about 500 to 2,000 Å, and said bolometer thin film consisting essentially of a manganese-based oxide; and an infrared reflection film formed on said lower layer portion;

wherein said upper layer portion and said lower layer portion are spaced apart from each other while sandwiching a vacuum or sealed gas to form a thermal isolation structure, and also electrically connected to each other through an electrode film formed on or in said insulating protective film or in said insulating protective film; and wherein a space causing destructive interference of incident infrared frequencies is formed between said bolometer thin film and said infrared reflection film, whereby the infrared frequencies which in the past have caused a destructive interference are absorbed by said bolometer thin film.

2. The device of claim 1 wherein a sacrificial layer is formed on said insulating protection layer, and a thermal isolation structure is formed by wet etched said sacrificial layer after formation of said insulating protective layer.

3. The device of claim 2 wherein said sacrificial layer is a polysilicon film.

4. A thermal infrared detecting device comprising:

a lower layer portion having a readout circuit; and an upper layer portion having a bolometer thin film covered with an insulating protective film to perform heat/resistive conversion, said bolometer thin film having a resistivity in the order of about 1 to 10 mΩcm and a thickness of about 500 to 2,000 Å, and said bolometer thin film consisting essentially of a vanadium compound; and an infrared reflection film formed on said lower layer portion;

wherein said upper layer portion and said lower layer portion are spaced apart from each other while sandwiching a vacuum or sealed gas to form a thermal isolation structure, and also electrically connected to each other through an electrode film formed in or on said insulating protective film formed on said insulating protective film, and wherein a space causing destructive interference of incident infrared frequencies is formed between said bolometer thin film and said infrared reflection film, whereby the infrared frequencies which in the past have caused a destructive interference are absorbed by said bolometer thin film.

5. The device of claim 4 wherein a sacrificial layer is formed on said insulating protection layer, and a thermal isolation structure is formed by wet etched said sacrificial layer after formation of said insulating protective layer.

6. The device of claim 5 wherein said sacrificial layer is a polysilicon film.

* * * * *